(12) United States Patent
Imura

(10) Patent No.: US 10,298,147 B2
(45) Date of Patent: May 21, 2019

(54) POWER DEVICE

(71) Applicant: DENSO CORPORATION, Kariya, Aichi-pref. (JP)

(72) Inventor: Takashi Imura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/951,724

(22) Filed: Apr. 12, 2018

(65) Prior Publication Data

US 2018/0316279 A1     Nov. 1, 2018

(30) Foreign Application Priority Data

Apr. 28, 2017   (JP) .................................. 2017-89370

(51) Int. Cl.
| | |
|---|---|
| *H02M 1/36* | (2007.01) |
| *H02M 7/5375* | (2006.01) |
| *H03K 17/14* | (2006.01) |
| *H02M 7/5387* | (2007.01) |
| *H02M 1/00* | (2006.01) |

(52) U.S. Cl.
CPC ........... *H02M 7/5375* (2013.01); *H02M 1/36* (2013.01); *H02M 7/53871* (2013.01); *H03K 17/145* (2013.01); *H02M 2001/0038* (2013.01)

(58) Field of Classification Search
CPC .. H02M 1/32; H02M 1/36; H02M 2001/0025; H02M 7/53; H02M 7/5375
See application file for complete search history.

(56) References Cited

U.S. PATENT DOCUMENTS

| | | | |
|---|---|---|---|
| 6,194,792 B1 | 2/2001 | Yanou et al. | |
| 2002/0176216 A1* | 11/2002 | Del Signore, II | H02H 9/001 361/93.9 |
| 2008/0150369 A1 | 6/2008 | Suzuki et al. | |
| 2013/0342174 A1* | 12/2013 | Schlak | H02H 9/002 320/166 |
| 2014/0159679 A1* | 6/2014 | Galloway | H02M 3/156 323/271 |
| 2016/0301235 A1* | 10/2016 | Okanoue | H02H 11/003 |
| 2018/0083527 A1* | 3/2018 | Fukuda | H02J 7/00 |
| 2018/0254731 A1* | 9/2018 | Ishita | H02P 27/06 |

FOREIGN PATENT DOCUMENTS

| | | |
|---|---|---|
| JP | S61-138334 U | 8/1986 |
| JP | 5127387 B2 | 1/2013 |
| JP | 2013-182701 A | 9/2013 |

* cited by examiner

*Primary Examiner* — Gary L Laxton
(74) *Attorney, Agent, or Firm* — Posz Law Group, PLC

(57) ABSTRACT

A power device includes a semiconductor relay and a pre-charger that has a reference voltage generator and a controller. The semiconductor relay is disposed at a position between a battery supplying electric power to a power converter that serves as a load and a smoothing capacitor connected on a battery side of the power converter in parallel with the power converter. The reference voltage generator generates a reference voltage having a gradually-increasing voltage value in a pre-charge period, prior to a turning ON of the semiconductor relay accompanying a turning ON of an ignition switch. The controller controls the semiconductor relay such that a charge voltage which is an inter-terminal voltage of the smoothing capacitor is set to a preset value according to the reference voltage.

6 Claims, 8 Drawing Sheets

| CONTROL PATTERN Cr | X 4C | Y 2C | Z 1C |
|---|---|---|---|
| 1ST CAPACITOR | CON. | CON. | CON. |
| 2ND CAPACITOR | CON. | CON. | DISCON. |
| 3RD CAPACITOR | CON. | DISCON. | DISCON. |
| 1ST COMPARATOR | L | H | H |
| 2ND COMPARATOR | L | L | H |

LEGEND
CON. : CONNECTED
DISCON. : DISCONNECTED

US 10,298,147 B2

POWER DEVICE

CROSS REFERENCE TO RELATED APPLICATION

The present application is based on and claims the benefit of priority of Japanese Patent Application No. 2017-089370, filed on Apr. 28, 2017, the disclosure of which is incorporated herein by reference.

TECHNICAL FIELD

The present disclosure generally relates to a power device.

BACKGROUND INFORMATION

Conventionally, a rush current prevention technique is implemented for preventing a load (e.g., an inverter) that receives power supply (i.e., supply of a direct current) via a relay, by storing electric charge in advance in a smoothing capacitor that is connected in parallel with the load and by turning ON the relay afterward.

For example, a power device disclosed in a patent document 1 i.e., Japanese Patent No. 5127387, includes a pre-charge circuit that is connected in parallel with a relay. The pre-charge circuit includes a switch such as MOSFET or the like. The power device in such configuration stores electric charge in advance in a smoothing capacitor before turning ON of the relay.

The configuration that includes a pre-charge circuit must increase an electric current flowing in the pre-charge circuit for pre-charging of a large capacity capacitor in a short time. That is, such a configuration must have a large capacity semiconductor switch that allows a large electric current, which may lead to an increase of the production cost, for example.

Further, as a different configuration, a current sensing resistor disposed at a position between a direct current power source and a relay for a constant current control of the relay may also be used for the pre-charging. However, disposing a resistor in a main current path leads to an increase of the circuit loss.

SUMMARY

It is an object of the present disclosure to provide a power device that is capable of reducing a circuit loss and/or a production cost while preventing/limiting a rush current.

The present disclosure devises the following configuration as a technique for implementing the above-described purposes.

In an aspect of the present disclosure, the power device may include a semiconductor relay disposed at a position between a direct current power source and supplying electric power to a load and a smoothing capacitor connected on a power source side of the load in parallel with the load. The power device may further include a reference voltage generator generating a reference voltage that has a voltage value gradually increasing in a pre-charge period during which the smoothing capacitor is charged before a turning ON of the semiconductor relay. The power device may also include a controller controlling the semiconductor relay such that an inter-terminal voltage of the smoothing capacitor has, or is set to, a preset value according to the reference voltage.

According to the power device described above, the inter-terminal voltage of the capacitor may increase as the reference voltage increases in the pre-charge period. That is, in other words, before supplying the electric power from the direct current power source to the load by the turning ON of the semiconductor relay, the smoothing capacitor is pre-chargeable and the rush current may be preventable or limited.

Further, the pre-charge circuit including a semiconductor relay may be dispensable, thereby enabling a reduction of the production cost even when the large capacity smoothing capacitor is pre-charged in a short time. Further, the current sensing resistor for the constant current control in parallel with the semiconductor relay is also dispensable (i.e., is not required in the present disclosure), thereby enabling a reduction of the circuit loss.

That is, as described above, while preventing/limiting the rush current, both the circuit loss and the production cost are reducible.

BRIEF DESCRIPTION OF THE DRAWINGS

Objects, features, and advantages of the present disclosure will become more apparent from the following detailed description made with reference to the accompanying drawings, in which.

DETAILED DESCRIPTION

At least two embodiments are described with reference to the drawings. The same numeral is assigned to the same/corresponding structure/function in those embodiments.

(First Embodiment)

Figure 1:
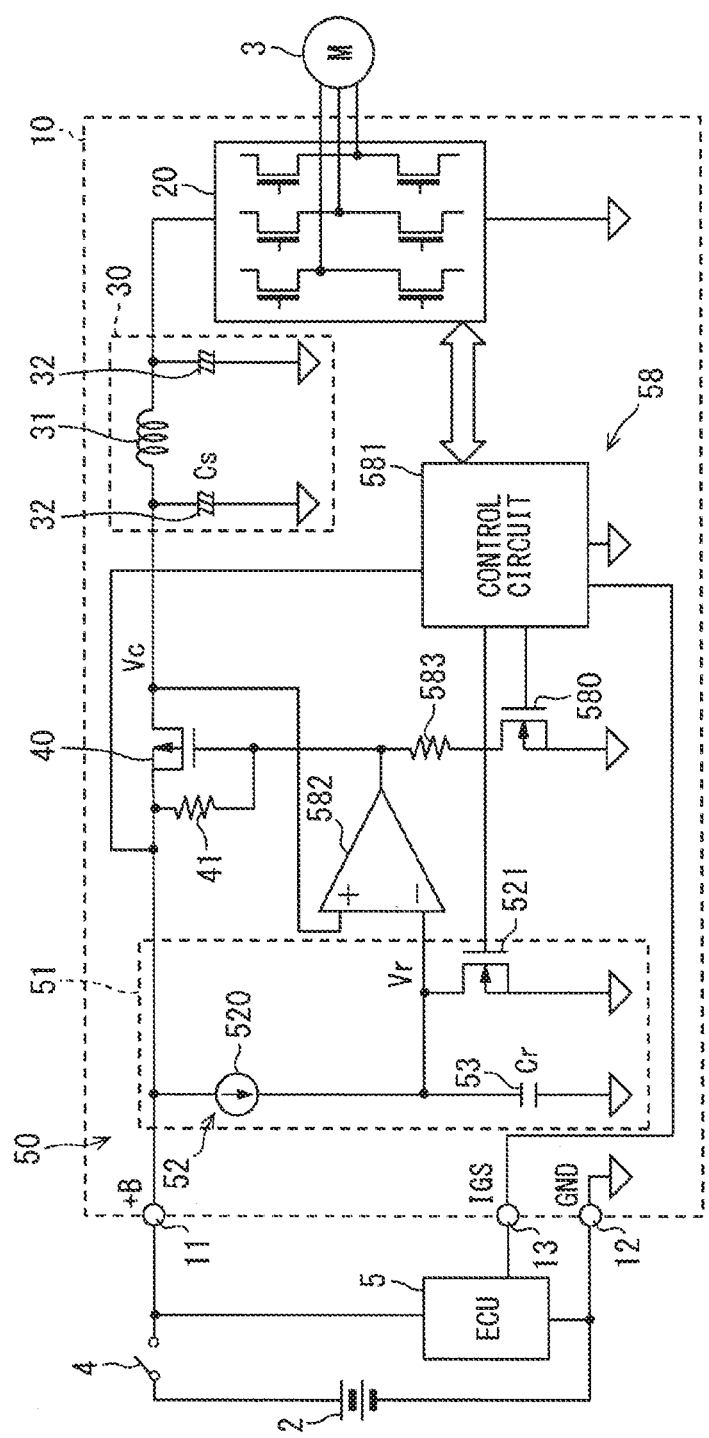
FIG. 1 is a block diagram of configuration of a power converter having a pre-charger regarding a first embodiment of the present disclosure.

First, based on FIG. 1, an outline configuration of a power converter provided with a pre-charge unit concerning the present embodiment is described. This power converter is disposed, for example, in vehicles, such as an electric vehicle and a hybrid vehicle.

As shown in FIG. 1, a power converter 10 converts the electric power supplied from a battery 2, and outputs it to a motor 3. In such manner, the motor 3 is driven for a travel of a vehicle. The battery 2 corresponds to a direct current power source. The power converter 10 is provided with power supply terminals 11 and 12 and an IGS terminal 13 respectively as an external connection terminal.

The power supply terminal 11 is a +B terminal connected to a positive electrode (i.e., to a high potential side) of the battery 2. The power supply terminal 12 is a ground (GND) terminal connected to a negative electrode (i.e., to a low potential side) of the battery 2. The IGS terminal 13 is a terminal to which an operation signal which controls operation of the power converter 10 according to an ON-OFF state of an ignition switch 4 connected to the positive electrode of the battery 2 is input. Hereafter, the signal input to the IGS terminal 13 is simply designated as a signal according to the ON-OFF state of the ignition switch 4. The ignition switch 4 may also be designated as a main switch. The ignition switch 4 is disposed at a position between the battery 2 and the power supply terminal 11, i.e., on a high potential power supply line connected to the positive electrode of the battery 2.

The signal which shows the ON-OFF state of the ignition switch 4 is input to a high-level ECU relative to the power converter 10, e.g., to an engine ECU 5. The engine ECU 5 outputs a signal according to the ON-OFF state of the ignition switch 4 to the IGS terminal 13 of the power converter 10.

The power converter 10 is provided with a power conversion section 20, a filter 30, a semiconductor relay 40, and a pre-charger 50. The pre-charger 50 is substantially provided with the above-described power supply terminals 11 and 12 and the IGS terminal 13.

The power conversion section 20 converts the electric power (i.e., direct current) supplied from the battery 2. As the power conversion section 20, an inverter or a converter may be employable, for example, The power conversion section 20 is disposed at a position between the high potential power supply line, and a low potential power supply line connected to the negative electrode of the battery 2, i.e., a ground line.

According to the present embodiment, a three-phase inverter is adopted as the power conversion section 20, and three-phase output lines are electrically connected to corresponding coils in the motor 3. The power conversion section 20 (i.e., an inverter) corresponds to a load.

The filter 30 has an inductor 31 and a smoothing capacitor 32. The inductor 31 (i.e., a coil), together with the smoothing capacitor 32, constitutes an LC filter. The smoothing capacitor 32 is connected in parallel to the power conversion section 20 which is a load. The smoothing capacitor 32 is disposed, on one side of the power conversion section 20 (i.e., on a close-to-battery 2 side), at a position between the high potential power supply line and the low potential power supply line.

In the present embodiment, the filter 30 is constituted by the two smoothing capacitors 32 and one inductor 31. When the semiconductor relay 40 described later is switched from OFF to ON, the electric power is supplied to the power conversion section 20 from both of the battery 2 and the smoothing capacitor 32. Specifically, a high electric power is momentarily/instantaneously supplied from the smoothing capacitors 32 to the power conversion section 20. Since the maximum electric power that may be instantly supplied to the power conversion section 20 is proportional to a static capacitance, the smoothing capacitor 32 having high capacity (i.e., large capacitance) is adopted in the present embodiment. According to the present embodiment, a total capacitance Cs of the smoothing capacitor 32 is 1000 µF.

The semiconductor relay 40 is disposed at a position between the battery 2 and the filter 30 containing the smoothing capacitor 32. The semiconductor relay 40 is disposed on at least one of the high potential power supply line or the low potential power supply line. According to the present embodiment, a p channel type MOSFET is adopted as the semiconductor relay 40, and this semiconductor relay 40 is disposed at a position between the power supply terminal 11 and the filter 30 on the high potential power supply line. The drain of the p channel type MOSFET is connected to the filter 30, and the source thereof is connected to the power supply terminal 11. Further, the gate thereof is connected to the source via a resistor 41. The semiconductor relay 40 may be implemented as a combination of an n channel type MOSFET and a booster circuit.

The semiconductor relay 40 is switched from OFF to ON by the turning ON of the ignition switch 4. Thereby, the electric power is may be supplied from the battery 2 to the smoothing capacitor 32 and to the power conversion section 20. Further, in a pre-charge period before the turning ON of the semiconductor relay 40 triggered by the turning ON of the ignition switch 4, the semiconductor relay 40 is controlled in order to accumulate/store electric charge in the smoothing capacitor 32.

The pre-charger 50 is disposed at a position between (i) the battery 2 and (ii) the power conversion section 20 and the filter 30. The pre-charger 50 pre-charges the smoothing capacitor 32, prior to switching the semiconductor relay 40 to ON that is triggered by the turning ON of the ignition switch 4. In addition to the above-described semiconductor relay 40, the pre-charger 50 has a reference voltage generator 51 and a controller 58. A power device is configured to be provided with the semiconductor relay 40 and the pre-charger 50.

The reference voltage generator 51 generates a reference voltage Vr that is compared with a charge voltage Vc, i.e., an inter-terminal voltage between two terminals of the smoothing capacitor 32 when the reference voltage generator 51 pre-charges the smoothing capacitor 32. According to the present embodiment, the reference voltage generator 51 has a constant current circuit 52 (i.e., a current regulator) and a reference capacitor 53.

The constant current circuit 52 generates a constant current Ir for charging the reference capacitor 53. According to the present embodiment, the constant current circuit 52 has a constant current source 520 and a switch 521. The constant current source 520 supplies the constant current Ir regardless of a power source voltage supplied from the battery 2.

The switch 521 is disposed at a position in between the high potential power supply line and the low potential power supply line, i.e., in series with the constant current source 520 that is put on a high potential side of the switch 521. According to the present embodiment, an n channel type MOSFET is adopted as the switch 521. The drain of the n channel type MOSFET is connected to the constant current source 520, and the source of the n channel type MOSFET is connected to the low potential power supply line (i.e., to the ground). The gate of the switch 521 is connected to a control circuit 581 (IC) described later.

The reference capacitor 53 is connected in parallel with the switch 521. The switch 521 is connected to the constant current source 520 at a position closer to an operational amplifier 582, which is later described, than the reference capacitor 53. The capacitance Cr of the reference capacitor 53 is set to be sufficiently smaller than the capacitance Cs of the smoothing capacitor 32. As the reference capacitor 53, a capacitor with the capacitance Cr of 1 µF, for example, is adopted.

In the reference voltage generator 51 constituted in such manner, the turning ON of the switch 521 provides a current path between the high potential power supply line and the low potential power supply line via the switch 521 and the constant current source 520. Therefore, the reference capacitor 53 is not charged. On the other hand, the turning OFF of the switch 521 leads to the charging of the reference capacitor 53.

The controller 58 controls the semiconductor relay 40 based on the signal from the engine ECU 5 via the IGS terminal 13. Further, the controller 58 (i.e., the control circuit 581 described later) also controls turning ON and OFF of a switch which constitutes the power conversion section 20. The controller 58 has a switch 580, the control circuit 581, and the operational amplifier 582. In FIG. 1, a white arrow represents, i.e., illustrates, a control of the power conversion section 20 by the control circuit 581.

The switch 580 is disposed at a position between the gate of a MOSFET which constitute the semiconductor relay 40 and the low potential power supply line, in order to control the turning ON and OFF of the semiconductor relay 40. According to the present embodiment, the n channel type MOSFET is adopted as the switch 580. The drain of the n channel type MOSFET is connected to the gate of the semiconductor relay 40 via a resistor 583, and the source is connected to the low potential power supply line. The gate of the switch 580 is connected to the control circuit 581. The gate of the semiconductor relay 40 is electrically connected to the low potential power supply line by the turning ON of the switch 580, and the semiconductor relay 40 is thus turned ON. The details of the control circuit 581 are described later.

Among the input terminals of the operational amplifier 582, an inverted input terminal (−) receives an input of the reference voltage Vr which is the inter-terminal voltage of the reference capacitor 53. The inverted input terminal is connected to a junction point of the constant current source 520 and the reference capacitor 53. That is, it is connected to the drain of the switch 521. On the other hand, a non-inverted input terminal (+) receives an input of the charge voltage Vc of the smoothing capacitor 32. The non-inverted input terminal is connected to a position between the semiconductor relay 40 and the filter 30 on the high potential power supply line, i.e., to the positive electrode/cathode of the smoothing capacitor 32. The output terminal of the operational amplifier 582 is connected to the gate of the semiconductor relay 40. Therefore, the semiconductor relay 40 is controlled by the output of the operational amplifier 582.

Figure 2:
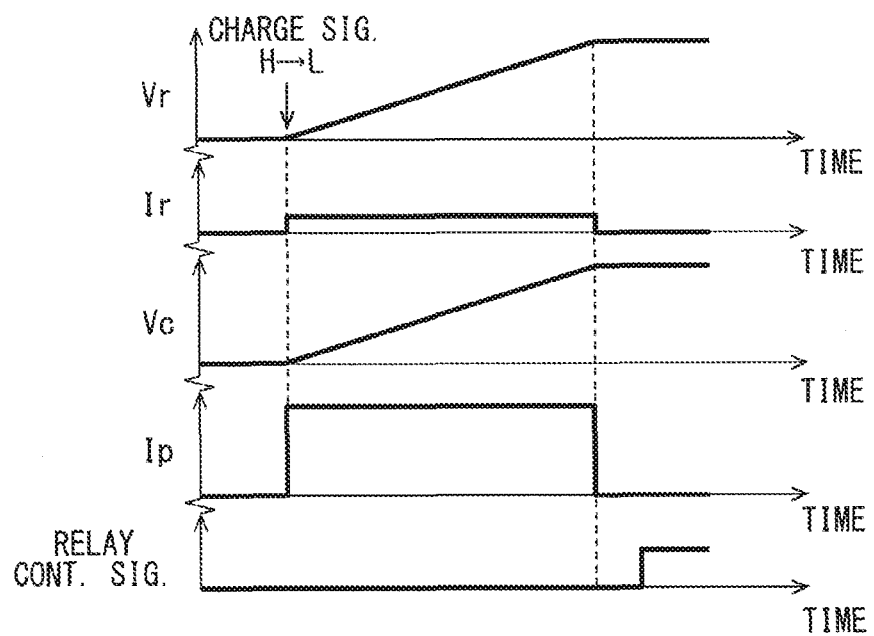
FIG. 2 is a time chart of an operation of the power converter at a start-up time.

Next, pre-charge of the smoothing capacitor 32 is described based on FIGS. 1 and 2.

As described above, the engine ECU 5 outputs the signal according to the ON-OFF state of the ignition switch 4 to the IGS terminal 13 of the power converter 10. For example, when the ignition switch 4 is turned ON, the signal of H level is output, and when the ignition switch 4 is turned OFF, the signal of L level is output. Now, the signal output to the gate of the switch 580 from the control circuit 581 is designated as a relay control signal. Further, the signal output to the gate of the switch 521 from the control circuit 581 is designated as a charge signal.

When the signal of L level is input to the control circuit 581 through the IGS terminal 13, the control circuit 581 outputs the signal of L level as a relay control signal, and outputs the signal of H level as a charge signal. Thereby, the switch 580 is turned OFF. Further, the switch 521 is turned ON, and a current path via the constant current source 520 and the switch 521 are formed. Therefore, electric charge is not accumulated/stored in the reference capacitor 53.

According to the above, the semiconductor relay 40 is not turned ON and electric charge is not accumulated/stored in the smoothing capacitor 32.

When the signal of H level is input to the control circuit 581 through the IGS terminal 13, the control circuit 581 first outputs the signal of L level as a charge signal while outputting the signal of L level as a relay control signal. The switch 580 is maintained in an OFF state. On the other hand, the switch 521 switches from ON to OFF. The signal of L level output as a charge signal is a signal which instructs a start of pre-charging.

When the switch 521 switches to an OFF state, as shown in FIG. 2, charging of the reference capacitor 53 is started. Since the reference capacitor 53 is charged by the current Ir of constant value, the reference voltage Vr rises with a constant inclination, i.e., a linear slope. An inclination, or a slope, is the amount of voltage change per unit time.

When a difference between the reference voltage Ur and the charge voltage Vc is large in a positive value, a resistance between the drain and the source of the semiconductor relay 40 becomes small, and the charge voltage Vc rises. When the difference between the reference voltage Vr and the charge voltage Vc decreases as the charge voltage Vc rises, the operational amplifier 582 decreases the gate voltage at the gate of the semiconductor relay 40. Thus, the operational amplifier 582 controls the gate voltage of the semiconductor relay 40 so that the charge voltage Vc input to a non-inverted input terminal and the reference voltage Vr input to an inverted input terminal become equal. Therefore, the charge voltage Vc of the smoothing capacitor 32 also rises gradually with the same inclination as the reference voltage Vr. In a pre-charge period, a pre-charge current Ip charging the smoothing capacitor 32 has a value proportional to a charging current Ir×(Cs/Cr) for charging the reference capacitor 53.

When the charge voltage Vc reaches the power source voltage input to the power supply terminal 11, the control circuit 581 outputs the signal of H level as a charge signal. Thereby, pre-charging of the smoothing capacitor 32 is complete. The reference voltage Vr also reaches the power source voltage at the same timing as the charge voltage Vc. That is, the reference voltage Vr and the charge voltage Vc both reach the same value as the power source voltage. Note that, by setting a preset voltage that is lower than the power source voltage as a threshold, completion of pre-charging may be determined when the charge voltage Vc or the reference voltage Vr reaches the threshold.

When a predetermined amount of time passes/lapses after pre-charging is complete, the control circuit 581 outputs the signal of H level as a relay control signal. Thereby, the switch 580 is turned to an ON state, and the semiconductor relay 40 is turned ON. As described above, according to the present embodiment, in the pre-charge period before the turning ON of the semiconductor relay 40, electric charge can be accumulated in the smoothing capacitor 32.

Next, the effects of the above-described power device and the power converter 10 are described.

According to the present embodiment, in a pre-charge period, the reference voltage Vr which has a gradually rising voltage value is generated by the reference voltage generator 51. Further, the semiconductor relay 40 is controlled so that the charge voltage Vc of the smoothing capacitor 32 becomes equal to the reference voltage Vr, and thereby, the smoothing capacitor 32 is pre-charged. Therefore, a rush current is controlled/prevented.

Further, a conventional pre-charge circuit including a semiconductor switch, i.e., a bypass circuit for bypassing a semiconductor relay, becomes unnecessary. Therefore, even without adopting a semiconductor switch with a large current capacity like a pre-charge circuit, the smoothing capacitor 32 having a large capacity can be pre-charged in a short time. Therefore, compared with the conventional configuration having a pre-charge circuit, a production cost can be reduced and an increase of the product volume can be prevented.

Further, a current sensing resistor used in the conventional constant current control becomes unnecessary. Thus, without using the current sensing resistor in a main path, i.e., not needing the resistor connected in series with a semiconductor relay, a circuit loss is reduced by the amount conventionally caused by such current sensing resistor.

Based on the above, according to the pre-charger 50 of the present embodiment and the power converter 10 having such pre-charger 50, a circuit loss and a production cost can be reduced, while controlling/preventing a rush current at a power ON time.

Further, according to the present embodiment, throughout the pre-charge period, the reference voltage Vr has a fixed inclination/slope and rises linearly. Thereby, the pre-charge current Ip is controlled to be a constant current. Thus, an excessive current flowing into a connector of an external connection terminal, i.e., into the connector of the power supply terminal 11, the ignition switch 4, or the like is prevented or limited, thereby preventing or limiting the melting of the terminal or the like.

In the present embodiment, the reference voltage generator 51 comprises the constant current circuit 52 including the constant current source 520 and the switch 521 and the reference capacitor 53. Thus, by adopting an analog circuit as the reference voltage generator 51, while generating the reference voltage Vr with a constant inclination, the circuit configuration is simplified, thereby enabling a reduction of a production cost. More specifically, since only one reference capacitor 53 is used in the present embodiment, the configuration is further simplified.

According to the present embodiment, the pre-charge current Ip charging the smoothing capacitor 32 is proportional to the current Ir×(Cs/Cr) charging the reference capacitor 53. The capacitance Cr of the reference capacitor 53 is very small compared with the capacitance Cs of the smoothing capacitor 32. Therefore, the pre-charge current Ip can be increased relative to the current Ir, thereby enabling a reduction of the pre-charge period.

Figure 3:
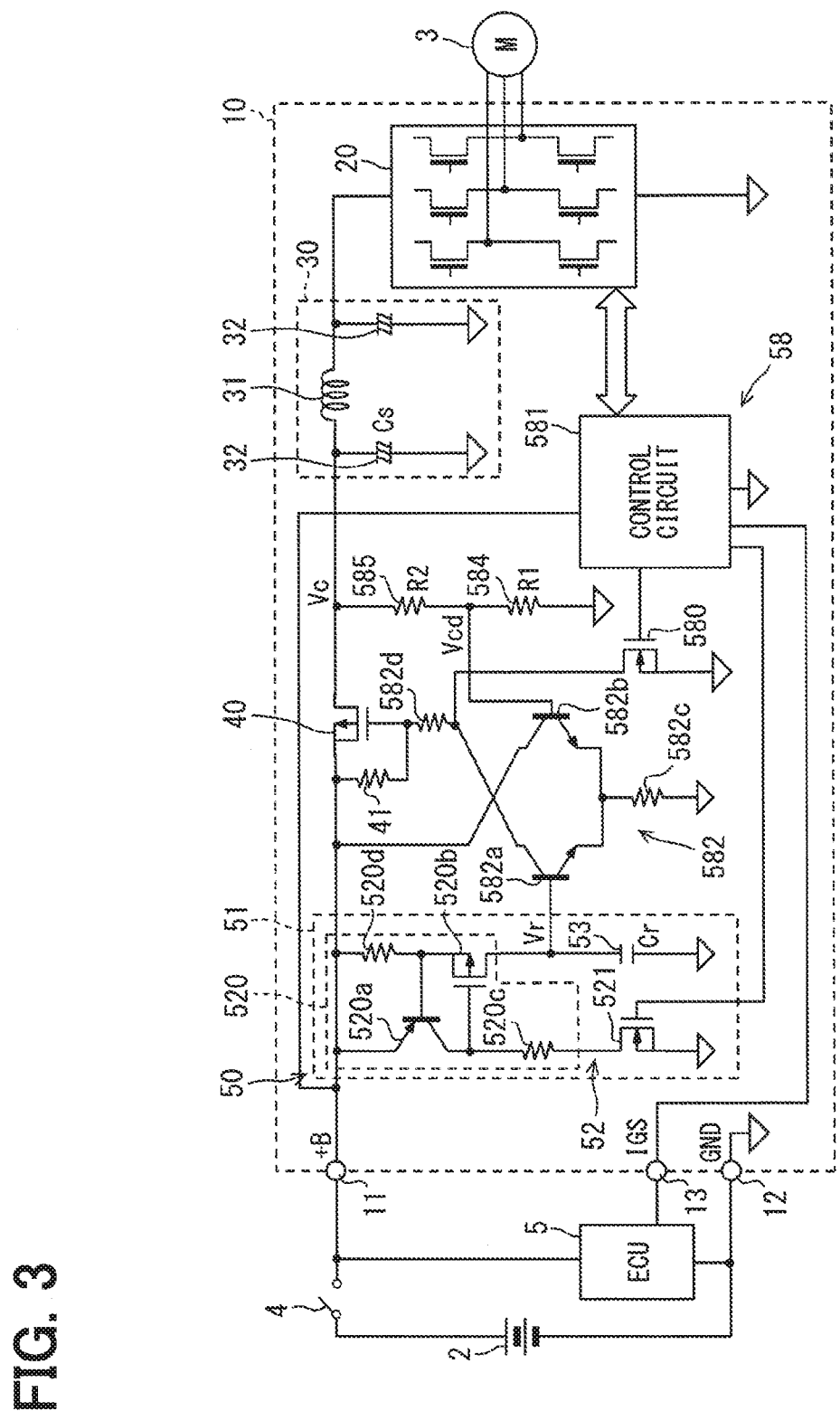
FIG. 3 is a block diagram of modified configuration of the power converter.

FIG. 3 shows a modification of the present embodiment. In this modification, the semiconductor relay 40 is controlled so that a division voltage derived by dividing the charge voltage Vc with a resistor becomes equal to the reference voltage Vr. In FIG. 3, a concrete configuration example of the constant current circuit 52 and the operational amplifier 582 is illustrated.

The constant current source 520 of the reference voltage generator 51 has switches 520a and 520b and resistors 520c and 520d. In FIG. 3, a pnp bipolar transistor is shown as the switch 520a, and a p channel type MOSFET is shown as the switch 520b. The emitter of the switch 520a is connected to the high potential power supply line, and the collector the switch 520a is connected to the drain of the switch 521 via the resistor 520c. On the other hand, the drain of the switch 520b is connected to the positive electrode/cathode of the reference capacitor 53, and the source of the switch 520b is connected to the emitter of the switch 520a via the resistor 520d.

Further, the operational amplifier 582 of the controller 58 is constituted as having switches 582a and 582b and resistor 582c and 582d. In FIG. 3, a npn bipolar transistor is shown as the switches 582a and 582b. The base of the switch 582a is connected at a junction point between the constant current source 520 and the reference capacitor 53. The emitter of the switch 582a is connected to a low potential connection line, that is, the ground or reference potential, via the resistor 582c, and the collector of the switch 582a is connected to the gate of the semiconductor relay 40 via the resistor 582d. On the other hand, the base of the switch 582b is connected to a junction point between two resistors 584, 585 that are connected in series to bridge between the high potential power supply line and the low potential power supply line, or ground/reference potential. Further, the emitter of the switch 582b is connected to the emitter of the switch 582a, and the collector of the switch 582b is connected to the high potential power supply line at a position that is closer to the battery 2 than the semiconductor relay 40.

Further, the reference capacitor 53 is connected to the constant current source 520 on an operational amplifier 582 side than the switch 521. In such configuration, when the switch 521 turns ON due to a switching of a charge signal from L level to H level, a collector current flows to the switch 520a to turn ON the switch 520b, and the reference capacitor 53 is charged by the current Ir. The reference voltage Vr rises by the charging of the reference capacitor 53, and the collector current flows to the switch 582a, and the semiconductor relay 40 turns ON. Thereby, the smoothing capacitors 32 are charged.

When the charge voltage Vc rises by the charging of the smoothing capacitor 32, a division voltage Vcd divided by the resistor also rises, and the collector current flows to the switch 582b. When the collector current flows to the switch 582b, a potential of a junction point between the switches 582a, 582b and the resistor 582c falls. Thus, a base-emitter voltage ($V_{BE}$) between the base and the emitter of the switch 582a falls, and the collector current of the switch 582a decreases, thereby decreasing the gate voltage at the gate of the semiconductor relay 40.

In such manner, the division voltage Vcd is controlled to be equal to the reference voltage Vr. The division voltage Vcd is a potential of the junction point of the resistors 584, 585, and is derived by dividing the charge voltage Vc with a resistor. Therefore, the charge voltage Vc is set as a preset voltage according to the reference voltage Vr. Further, the pre-charge current Ip is represented by the following equation 1.

$$Ip = \frac{R1 + R2}{R1} \cdot \frac{Cs}{Cr} \cdot Ir \qquad \text{[Equation 1]}$$

For example, based on an assumption that a resistance value R1 of the resistor 584 and a resistance value R2 of the resistor 585 are both 10 kΩ, the capacitance Cs of the smoothing capacitor 32 is 1000 µF, and the capacitance Cs of the reference capacitor 53 is 1 µF, the pre-charge current Ip=2000×Ir.

Further, in the above-described modification, as the switch 520a of the constant current source 520 constituting the reference voltage generator 51, the pnp bipolar transistor is adopted, and the reference voltage Vr has negative temperature characteristic/correlation based on the characteristic of a pn junction. That is, a permissible current of the semiconductor relay 40 becomes small when the temperature rises. However, according to the modification, the reference voltage Vr, i.e., the pre-charge current Ip, may decrease when the temperature rises. Therefore, the semiconductor relay 40 with a low rated current is employable.

(Second Embodiment)

The second embodiment of the present disclosure is described with reference to the preceding embodiment. That is, the same numerals as the preceding embodiments refer to the same components, without repeating the same descriptions, in terms of the power device and the power converter 10 which are shown in the preceding embodiment.

Figure 4:
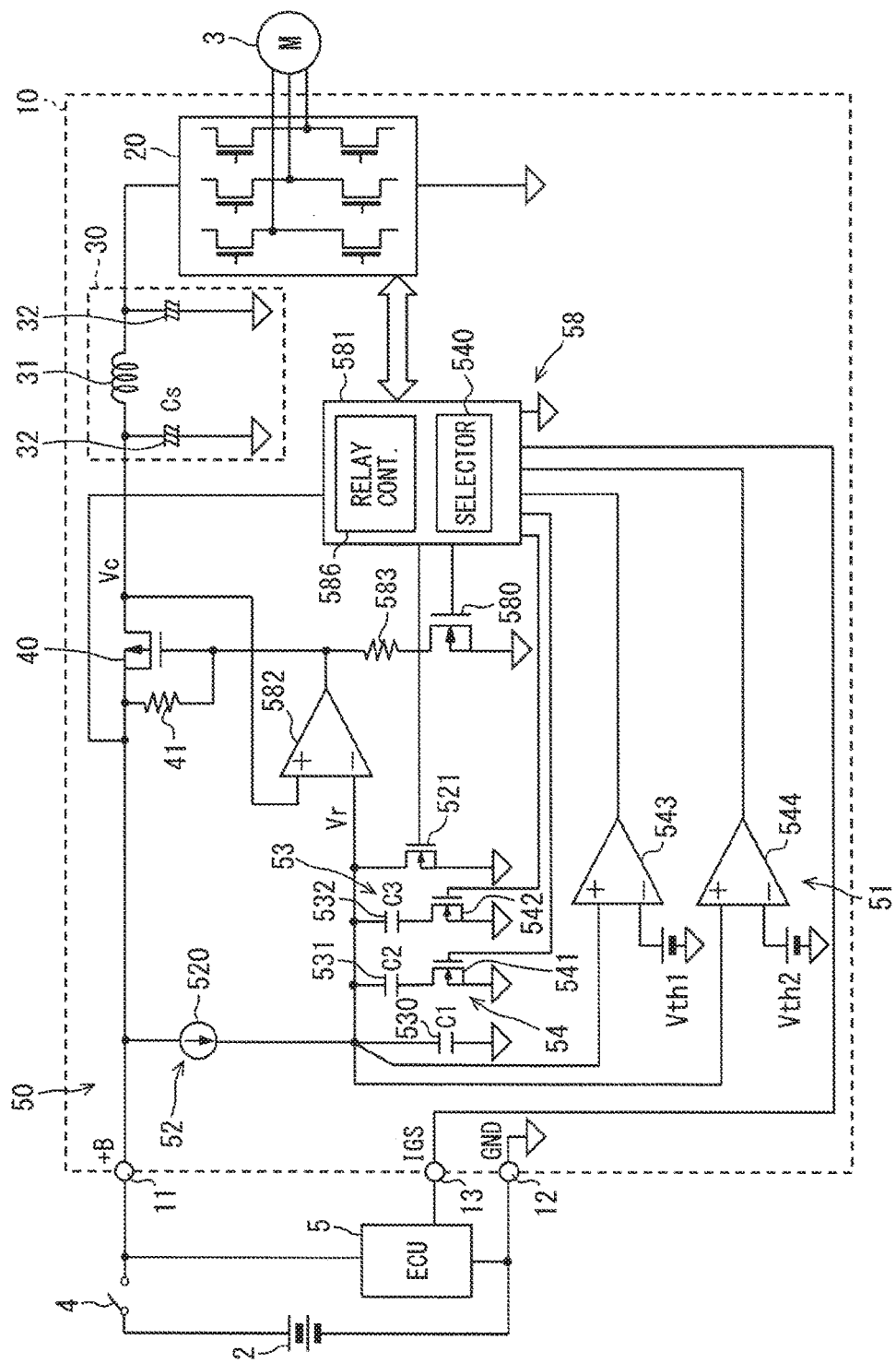
FIG. 4 is a block diagram of configuration of the power converter having the pre-charger regarding a second embodiment of the present disclosure.
Figures 5, 6:
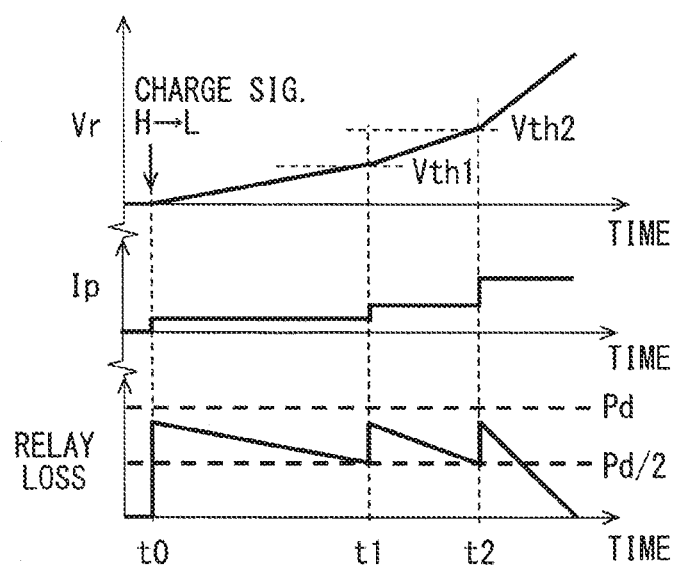
FIG. 5 is a table of control patterns according to an output of a comparator.
FIG. 6 is a time chart of an operation of the power converter at a start-up time.

As shown in FIG. 4, in the present embodiment, a plurality of the reference capacitors 53, for example, 530, 531, and 532, connected in parallel with each other are provided, and a capacity switcher 54 is configured to be capable of switching a total capacitance Cr of the plurality of the reference capacitors 53. In other words, the reference voltage Vr may be configured to have multiple inclinations, i.e., may have a graph that changes its slope at different points, as shown in FIG. 6.

The reference voltage generator 51 has a first capacitor 530, a second capacitor 531, and a third capacitor 532 respectively as the reference capacitor 53. According to the present embodiment, the ratio of a capacitance C1 of the first capacitor 530, a capacitance C2 of the second capacitor 531, and a capacitance C3 of the third capacitor 532 is set to C1:C2:C3=1:1:2.

The reference voltage generator 51 has the capacity switcher 54. The capacity switcher 54 has a selector 540, a first switch 541, a second switch 542, a first comparator 543, and a second comparator 544.

The selector 540 controls turning ON and OFF of the first switch 541 and the second switch 542 based on the output of the first comparator 543 and the second comparator 544. That is, the selector 540 selects a reference capacitor 53 which has an influence on the capacitance Cr. The selector 540 selects, i.e., determines, whether the second capacitor 531 and the third capacitor 532 are connected to the low potential power supply line.

In the present embodiment, the selector 540 is provided as a part of the control circuit 581. The function of the control circuit 581 described in the preceding embodiment is provided (i.e., designated) as a relay controller 586 of the control circuit 581 in the present embodiment. Note that the selector 540 may be provided separately from the control circuit 581.

The first switch 541 is disposed at a position between the second capacitor 531 and the low potential power supply line. The second switch 542 is disposed at a position between the third capacitor 532 and the low potential power supply line. According to the present embodiment, an n channel type MOSFET is adopted as the first switch 541 and the second switch 542. The drain of the first switch 541 is connected to the second capacitor 531, and the source of the first switch 541 is connected to the ground. Similarly, the drain of the second switch 542 is connected to the third capacitor 532, and the source of the second switch 542 is connected to the ground. The gate of each of the switches 541, 542 is connected to the control circuit 581, and a control signal is input from the selector 540. The first capacitor 530 and the switch 521 are disposed in the same manner as the preceding embodiment.

An inverted input terminal (−) of the first comparator 543 receives an input of a first threshold voltage Vth1. A non-inverted input terminal (+) of the first comparator 543 receives a voltage of the junction point between the reference capacitor 53 and the constant current source 520, i.e., the reference voltage Vr. An inverted input terminal (−) of the second comparator 544 receives an input of a second threshold voltage Vth2. A non-inverted input terminal (+) of the second comparator 544 receives an input of the reference voltage Vr. The value of the second threshold voltage Vth2 is set to be higher than the value of the first threshold voltage Vth1.

The first comparator 543 outputs the signal of L level when the reference voltage Vr is less than the first threshold voltage Vth1, and, when the reference voltage Vr is equal to or greater than the first threshold voltage Vth1, it outputs the signal of H level. The second comparator 544 outputs the signal of L level when the reference voltage Vr is less than the second threshold voltage Vth2, and, when the reference voltage Vr is equal to or greater than the second threshold voltage Vth2, it outputs the signal of H level.

FIG. 5 shows comparison results by the first comparator 543 and the second comparator 544, and the control patterns X, Y, Z by the selector 540. As described above, since the ratio of capacitances is set to C1:C2:C3=1:1:2, in FIG. 5, capacitances are set to C1=C2=1C and C3=2C, for the ease of understanding. That is, the C1 and C2 capacitance values may be equal, while the C3 capacitance value is double the capacitance value of C1 or C2.

For control pattern X, when each of the outputs of the first comparator 543 and the second comparator 544 is in L level, that is, when those outputs have not reached the first threshold voltage Vth1, i.e., have not reached a lower reference voltage Vr among Vth1 and Vth2, the selector 540 of the control circuit 581 outputs the signal of H level to each of the first switch 541 and the second switch 542. Thereby, the first switch 541 and the second switch 542 are respectively turned ON, and not only the first capacitor 530 but also the second capacitor 531 and the third capacitor 532 are connected to the low potential power supply line (i.e., to the ground). That is, as all the reference capacitors 53 are connected, the capacitance Cr (i.e., a total capacitance) amounts to 4C.

For control pattern Y, when the reference voltage Vr rises by the charging to be equal to or greater than the first threshold voltage Vth1 and to be less than the second threshold voltage Vth2, the output of the first comparator 543 is in H level, and the output of the second comparator 544 is in L level. In such case, the selector 540 outputs the signal of H level to the first switch 541, and outputs the signal of L level to the second switch 542. Thereby, the first switch 541 is turned ON and the second switch 542 is turned OFF, the first capacitor 530 and the second capacitor 531 are in a connected state, and the third capacitor 532 is in a disconnected state. Then, since the charging of only the first capacitor 530 and the second capacitor 531 is enabled by the current Ir, the capacitance Cr amounts to 2C.

For control pattern Z, when the reference voltage Vr rises further by the charging to be greater than the second threshold voltage Vth2, the output of each of the first comparator 543 and the second comparator 544 is in H level. In such case, the selector 540 outputs the signal of L level to each of the first switch 541 and the second switch 542. Thereby, each of the first switch 541 and the second switch 542 is turned OFF, and, the first capacitor 530 is in a connected state, and the second capacitor 531 and the third capacitor 532 are in a disconnected state. Then, since the charging of only the first capacitor 530 is enabled by the current Ir, the capacitance Cr amounts to 1C.

FIG. 6 shows an operation of the pre-charge period. At time t0, when a signal indicating that the ignition switch 4 is turned ON is input, the control circuit 581 (i.e., the relay controller 586) outputs the signal of L level as a relay control signal, and outputs the signal of L level as a charge signal.

Thereby, the switch 580 is put in an OFF state and the switch 521 switches from ON to OFF. Further, since the reference voltage Vr is less than the first threshold voltage Vth1, the control circuit 581 (i.e., the selector 540) outputs the signal of H level as a control signal of both of the first switch 541 and the second switch 542. Thereby, the first switch 541 and the second switch 542 are turned to an ON state, and the first capacitor 530, the second capacitor 531, and the third capacitor 532 are altogether put in a connected state.

Therefore, the capacitance Cr of the reference capacitor 53 amounts to 4C. When control pattern X is implemented in which the capacitance Cr amounts to 4C, the reference voltage Vr of the reference capacitor 53 has a fixed inclination, and rises with the smallest inclination among all control patterns. Further, the pre-charge current Ip is also a constant value, and is the smallest value among all control patterns.

When the reference voltage Vr rises by the charging, and reaches the first threshold voltage Vth1 at time t1, the output of the first comparator 543 switches from the signal of L level to the signal of H level as described above, and the selector 540 switches a control signal of the second switch 542 from the signal of H level to the signal of L level. Thereby, the first capacitor 530 and the second capacitor 531 are kept in a connected state, and the third capacitor 532 is put in a disconnected state. Therefore, the capacitance Cr of the reference capacitor 53 amounts to 2C.

When control pattern Y is implemented in which the capacitance Cr amounts to 2C, the reference voltage Vr of the reference capacitor 53 has a fixed inclination, and rises with a middle inclination among all control patterns. Further, the pre-charge current Ip is also a constant value, and takes a middle value among all control patterns.

When the reference voltage Vr rises further by the charging, and reaches the second threshold voltage Vth2 at time t2, the output of the second comparator 544 also switches from the signal of L level to the signal of H level as described above, and the selector 540 switches a control signal of the first switch 541 from the signal of H level to the signal of L level. Thereby, only the first capacitor 530 is kept in a connected state, and the second capacitor 531 and the third capacitor 532 are put in a disconnected state. Therefore, the capacitance Cr of the reference capacitor 53 amounts to 1C.

When control pattern Z is implemented in which the capacitance Cr amounts to 1C, the reference voltage Vr of the reference capacitor 53 is a fixed inclination, and rises with the biggest inclination among all control patterns. Further, the pre-charge current Ip is also a constant value, and takes the biggest value among all control patterns.

At each of time t0, time t1, and time t2, which are respectively a switch timing at which the inclination of the reference voltage Vr switches, i.e., a timing at which the value of the pre-charge current Ip switches, a relay loss becomes large. Now, a drain-source voltage ($V_{DS}$) between the drain and the source of the semiconductor relay 40 (i.e., a relay MOSFET) takes a value which is derived by subtracting the charge voltage Vc from the power source voltage. The relay loss is a multiplication value of the pre-charge current Ip which flows into the semiconductor relay 40 and the drain-source voltage. According to the present embodiment, each of the capacitances C1, C2, C3, the first threshold voltage Vth1, and the second threshold voltage Vth2 of the reference capacitor 53 are set so that the relay loss takes a value that is equal to or less than a target value Pd that is set to be lower than an allowable relay loss for the semiconductor relay 40.

After the setting of the capacitance Cr to 40, the first threshold voltage Vth1 is set to switch an inclination at a timing when the relay loss reaches one half of the target value Pd. Further, after changing the capacitance Cr to 2C, the second threshold voltage Vth2 is set to switch an inclination at a timing when the relay loss reaches one half of the target value Pd. Therefore, even when the inclination of the reference voltage Vr is switched in many stages/steps, the relay loss does not exceed the target value Pd, as shown in FIG. 6.

Next, the effects of the above-described power device and the power converter 10 are described.

The power converter 10 provided with the pre-charger 50 and the pre-charger 50 in the present embodiment can also achieve the same effects as the preceding embodiment. That is, a circuit loss and a production cost can be reduced, while preventing or limiting the rush current at a power ON time. Further, the reference voltage Vr changes linearly in the pre-charge period. Thereby, the pre-charge current Ip is controlled to have a constant value (i.e., a zero inclination).

Further, the inclination of the reference voltage Vr can be switched in many stages/steps. Thereby, the pre-charge period of the smoothing capacitor 32 is shortened, while reducing the relay loss.

Although the inclination of the reference voltage Vr is switched, the inclination of the reference voltage Vr is constant in each of short time periods, or "sub-periods", i.e., in a t0-t1 period, a t1-t2 period, and a period after t2 during the pre-charge period. Thereby, in each of the short time periods, the pre-charge current Ip is controlled to be constant.

Further, the inclination of the reference voltage Vr is controlled to become larger as a period of time from a start of the pre-charge period to a start of the short time periods increases. According to such control, the allowable relay loss allowed for the semiconductor relay 40 is further reducible while further shortening the pre-charge period.

Although, in the present embodiment, an example of switching the reference voltage Vr by using the first comparator 543 and the second comparator 544 is described, the present disclosure is not limited to such control scheme. For example, an A/D converter may also be employable.

(Third Embodiment)

The third embodiment of the present disclosure is described with reference to the preceding embodiments. That is, the same numerals as the preceding embodiments refer to the same components, without repeating the same descriptions, in terms of the power device and the power converter 10 which are shown in the preceding embodiments.

Figure 7:
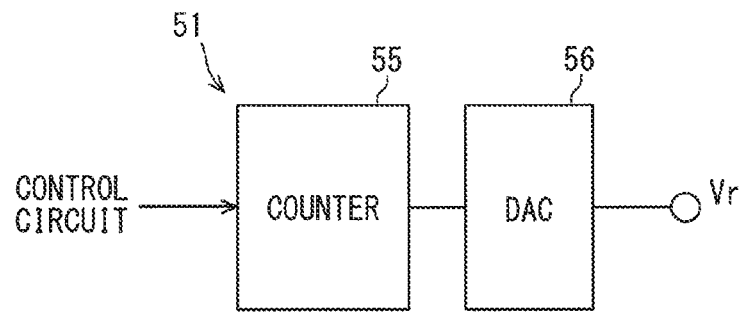
FIG. 7 is a block diagram of a part of the pre-charger regarding a reference voltage generator in a third embodiment of the present disclosure.

As shown in FIG. 7, the reference voltage generator 51 has a counter 55 and a digital-to-analog D/A converter 56 in the present embodiment.

When a signal indicative of the turning ON of the ignition switch 4 is input, the control circuit 581 outputs a signal that instructs a start of counting to the counter 55. The counter 55 is a digital circuit that starts counting by taking a signal from the control circuit 581 as a trigger. The counter 55 counts up a predetermined value at an interval of given period. The count value is output from the counter 55 to the D/A converter 56 (DAC). According to the present embodiment, a 10-bit counter 55 is adopted, the interval of counting is set to 1 ms, and a count-up value is set to 1. The interval and the count-up value are set and stored in advance. For example, the reference voltage generator 51 may store the preset interval values and count-up values.

Figure 8:
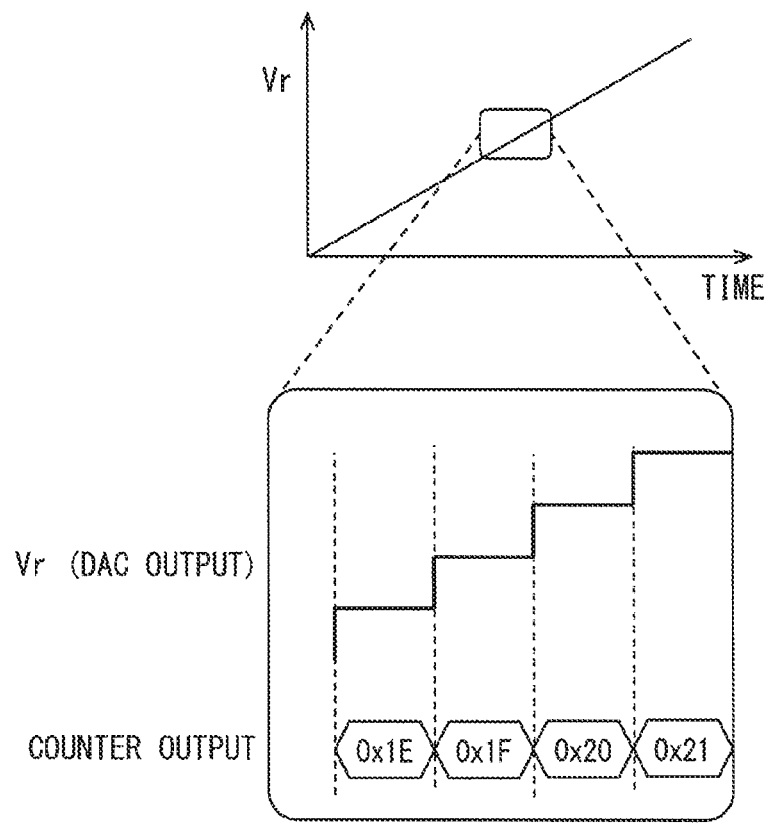
FIG. 8 is an illustrative diagram of a change of a reference voltage in a pre-charge period.

FIG. 8 shows the reference voltage Vr generated by the above-described reference voltage generator 51 in the pre-charge period. The D/A converter 56 generates the reference voltage Vr according to the output of the counter 55, and outputs Vr to the inverted input terminal of the operational amplifier 582 as shown in the preceding embodiment.

Thus, the reference voltage Vr with a constant inclination is generated in the present embodiment. Thereby, the pre-charge current Ip is controlled to have a constant value. Further, the inclination of the reference voltage Vr and the inclination of the charge voltage Vc are changeable by changing the interval and the count-up value which are preset values of the counter 55. That is, the value of the pre-charge current Ip is changeable.

(Fourth Embodiment)

The fourth embodiment of the present disclosure is described with reference to the preceding embodiments. That is, the same numerals as the preceding embodiments refer to the same components, without repeating the same descriptions, in terms of the power device and the power converter 10 which are shown in the preceding embodiments.

Figure 9:
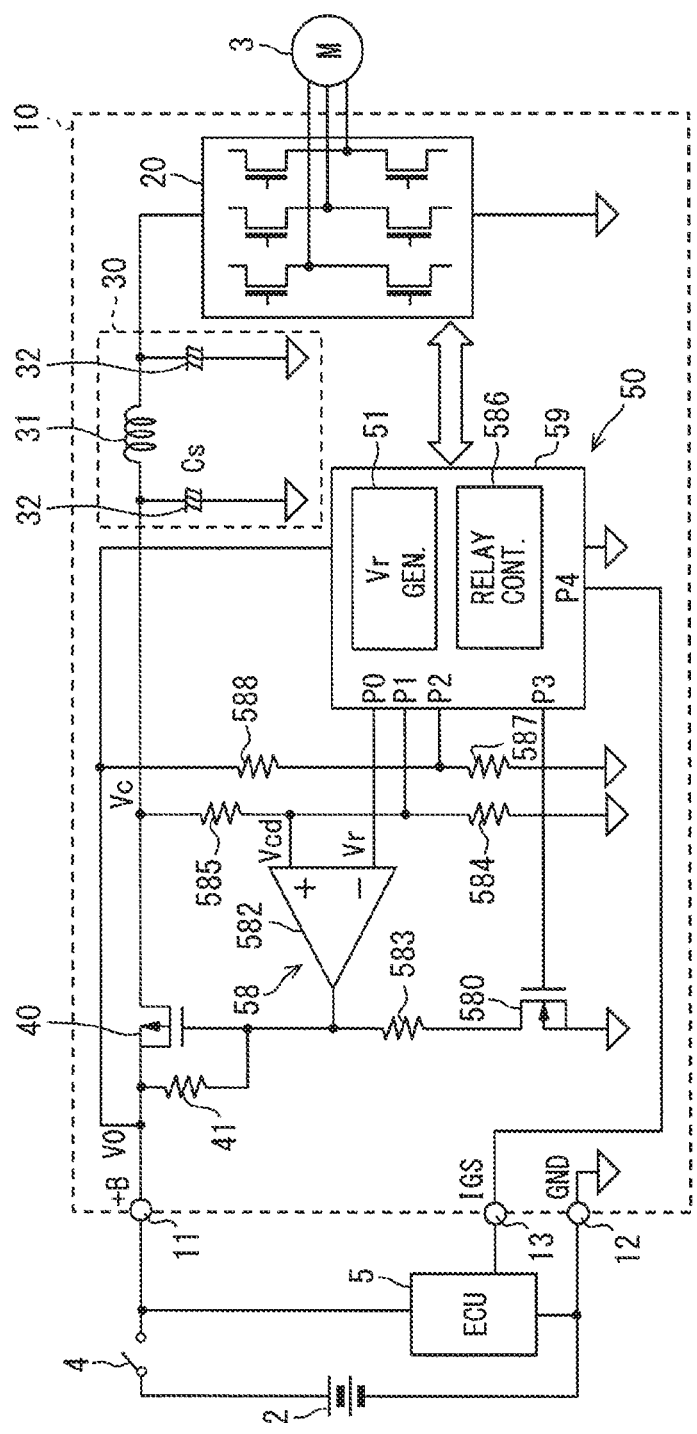
FIG. 9 is a block diagram of configuration of the power converter having the pre-charger regarding a fourth embodiment of the present disclosure.

As shown in FIG. 9, the pre-charger 50 of the present embodiment includes a microcomputer 59. The microcomputer 59 is a device which is provided with a CPU, a ROM, a RAM, a register, an I/O Port, and the like. In the microcomputer 59, the CPU performs predetermined processing according to the variety of information etc. which are obtained via the bus and by the execution of a control program stored in advance to the ROM, while using the temporary storage function of the RAM and/or the register. The signal derived from such processing is output to the bus, for example. In such manner, the microcomputer 59 performs various functions.

The microcomputer 59 has, as a functional block, the relay controller 586 that controls (i) the reference voltage generator 51 generating and outputting the reference voltage Vr and (ii) the switch 580, and ultimately (iii) the semiconductor relay 40. The controller 58 includes the relay controller 586, the switch 580, and the operational amplifier 582. Further, just like the second embodiment, the inclination of the reference voltage Vr is changed in multiple stages.

The microcomputer 59 has five ports P0-P4. The reference voltage Vr is output from P0 to the inverted input terminal of the operational amplifier 582. The division voltage Vcd which is a division of the charge voltage Vc of the smoothing capacitor 32 divided by the resistors 584, 585 is input to the non-inverted input terminal of the operational amplifier 582. Both of the resistors 584, 585 have the same resistance value in the present embodiment. Port P1 receives an input of the voltage Vcd (=Vc/2).

The division voltage, which is derived by dividing a power source voltage V0 supplied from the battery 2 by the resistors 587, 588, is input to port P2. According to the present embodiment, the resistors 587, 588 have the same resistance value. A relay control signal is output from port P3 to the gate of the switch 580. The signal according to a state of the ignition switch 4 is input to port P4 from the engine ECU 5 via the IGS terminal 13.

Figure 10:
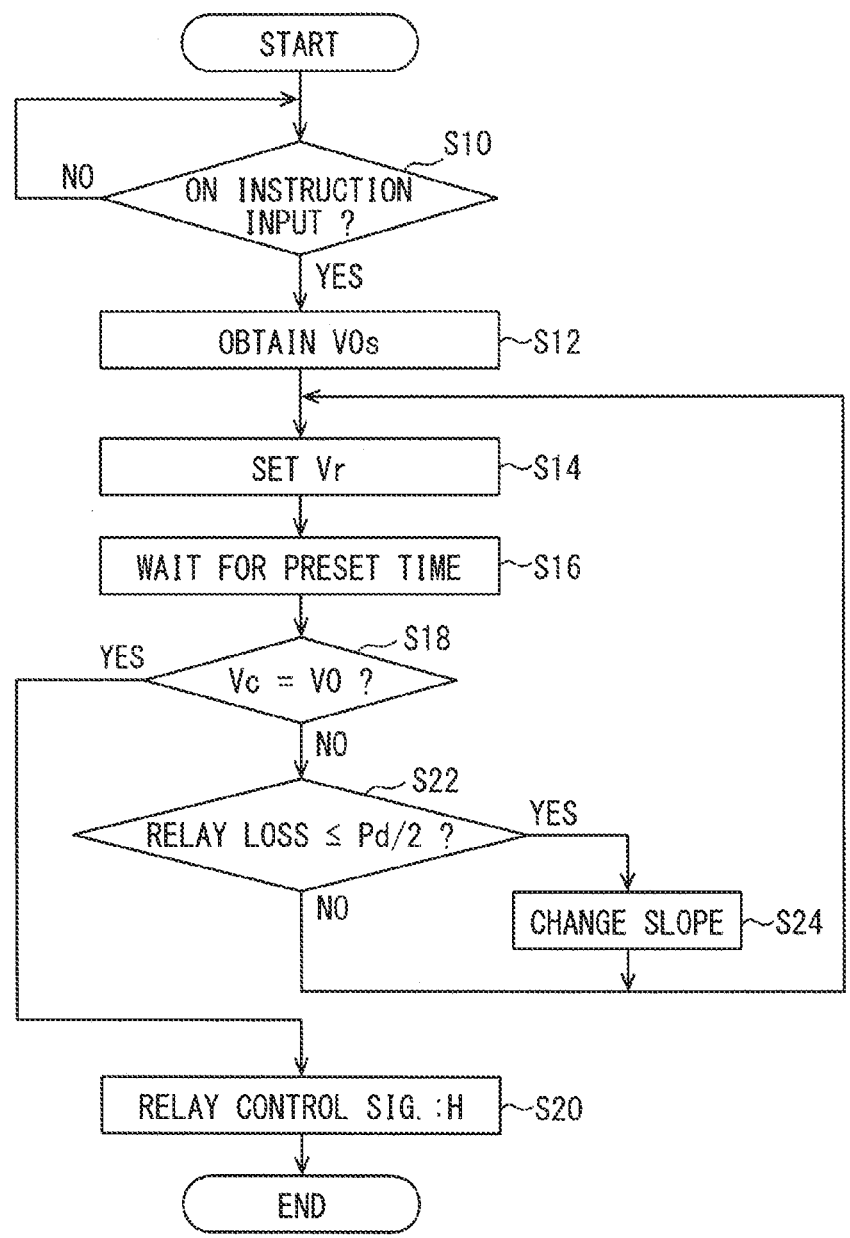
FIG. 10 is a flowchart of a process performed by a microcomputer.

Next, the processing performed by the microcomputer 59 is described based on FIG. 10. The microcomputer 59 performs the following processing at the power ON (start-up) time of the power converter 10.

The microcomputer 59 determines first whether an ON instruction of the semiconductor relay 40 is input (Step S10). More practically, it is determined whether a signal output from the engine ECU 5 has switched from L level indicative of the OFF state of the ignition switch 4 to H level indicative of the ON state of the ignition switch 4, thereby inputting the signal of H level to port P4. The microcomputer 59 repeats processing of Step S10 until the ON instruction is input.

When it is determined that the ON instruction has been input, subsequently the microcomputer 59 obtains an initial value V0s of the power source voltage V0 (Step S12). More specifically, the initial value V0s of the power source voltage V0 is obtained from an input to port P2, and it is stored in a memory.

Then, the microcomputer 59 sets the reference voltage Vr (Step S14). The microcomputer 59 sets the reference voltage Vr=Vr0+ΔVr based on a previous value Vr0 of the reference voltage Vr and a change amount ΔVr according to a preset inclination. When setting the reference voltage Vr subsequent to Step S12, a value of zero (0) is set as an initial value, i.e., as the previous value Vr0, and an initial value is also set for an inclination. The initial value of the inclination may be, for example, a minimum value of the inclination as shown in the second embodiment. The change amount is a product of the inclination and a preset time described later.

The microcomputer 59 waits for a preset time (Step S16), after setting the reference voltage Vr in Step S14, and it is subsequently determined whether the charge voltage Vc is equal to the power source voltage V0 (Step S18). According to the present embodiments, since the resistors 584, 585 have the same resistance value, and the resistors 587, 588 have the same resistance value, it is determined whether an input to port P1 and an input to port P2 are equal to each other.

In Step S18, when it is determined that the charge voltage Vc is equal to the power source voltage V0, the microcomputer 59 switches the relay control signal output from port P3 to H level (Step S20). Thereby, the switch 580 is put in an ON state and the semiconductor relay 40 is turned ON, and the process ends.

On the other hand, in Step 318, when it is determined that the charge voltage Vc is not equal to the power source voltage V0, the microcomputer 59 determines whether a relay loss is less than or equal to one half the target value Pd (Step S22). Here, as shown in FIG. 6 of the preceding embodiment, the pre-charge current Ip is proportional to the reference voltage Vr. In Step S22, the charge voltage Vc obtained from port P1 is subtracted from the initial value V0s obtained in Step S12, and the drain-source voltage between the drain and the source of the semiconductor relay 40 (=V0s−Vc) is calculated. Then, the reference voltage Vr after a preset time of waiting is used to multiply the drain-source voltage to calculate the relay loss. Note that the target value Pd here is a value in consideration of the proportional relationship between the reference voltage Vr and the pre-charge current Ip.

In Step S22, when it is determined that a relay loss is greater than one half of the target value Pd, the process returns to Step S14 without any specific processing, and processing of Step S14 and thereafter are performed. In Step S14, for the setting of the reference voltage Vr, the same inclination as the previous processing time is used. Further, the reference voltage Vr previously set in Step S14 is used as the previous value Vr0.

In Step S22, when it is determined that a relay loss is equal to or less than ½ of the target value Pd, the microcomputer 59 changes the inclination/slope of the reference voltage Vr (Step S24). For example, just like the second embodiment, when the inclination is set as three stage values, the inclination is set to the next stage value, i.e., a one stage ahead value that is larger than the current value. That is, when the minimum value is currently being set, the middle value is set, and when the middle value is currently being set, the maximum value is set. Note that the inclination may be changed by a multiplication process of an integer value, e.g., by a multiplication of 2. That is, the currently-set inclination may be doubled, for example.

The process returns to Step S14 after executing processing of Step S24, and processing after Step S14 is performed. In setting the reference voltage Vr in Step S14, the inclination set in Step S24 is used. The reference voltage Vr previously set in Step S14 is used as the previous value Vr0.

As described above, the same effects as the preceding embodiments are also achievable by the configuration that uses the microcomputer 59.

Further, as shown in the second embodiment (refer to FIG. 6), the inclination of the relay loss and the inclination of the reference voltage Vr are proportional. Therefore, the inclination can also be set based on the relay loss described above.

In the configuration using the microcomputer 59, the multi-stage switching of the reference voltage Vr is described. However, the present disclosure is not limited to such configuration. That is, as shown in the first embodiment, the inclination of the reference voltage Vr may be set to a constant, i.e., same, value throughout the pre-charge period.

Two or more components may be used to realize two or more functions instead of using only one component in the above-mentioned embodiment, or two or more components may be used to realize one function of one component.

One component may be used to realize two or more functions instead of using two or more components, or one component may be used to realize one function realized by using two or more components.

A part of the configuration of the above-mentioned embodiment may be omitted. At least a part of the configuration of the above-mentioned embodiment may be added to or replaced with the configuration of above-mentioned other embodiment(s).

Note that all modes derivable from the technical thought indicated by the wording in the claims are considered as embodiments of this disclosure.

According to the preceding embodiments, the change of the reference voltage Vr is described as a linear change, which is not limiting the embodiments. In the pre-charge period, the reference voltage Vr may at least rise gradually. For example, the reference voltage Vr may be generated as having a non-linear change, e.g., may have a curved graph in a diagram.

Although the present disclosure has been fully described in connection with embodiments thereof with reference to the accompanying drawings, it is to be noted that various changes and modifications will become apparent to those skilled in the art, and such changes, modifications, and summarized scheme are to be understood as being within the scope of the present disclosure as defined by appended claims.

What is claimed is:

1. A power device comprising:
  a semiconductor relay disposed at a position between a direct current power source and supplying electric power to a load and a smoothing capacitor connected on a power source side of the load in parallel with the load;
  a reference voltage generator generating a reference voltage that has a voltage value gradually increasing in a pre-charge period during which the smoothing capacitor is charged before a turning ON of the semiconductor relay; and
  a controller controlling the semiconductor relay to have a preset value as an inter-terminal voltage of the smoothing capacitor according to the reference voltage,
  wherein
  the reference voltage generator generates the reference voltage with the voltage value that linearly changes,
  the pre-charge period is divided into a plurality of sub-periods, and
  the reference voltage generator generates the reference voltage that has a different per-unit-time voltage change amount in the respective sub-periods and a constant per-unit-time voltage change amount in each of the sub-periods.

2. The power device in claim 1, wherein
  the reference voltage generator generates the reference voltage that has a constant inclination throughout the pre-charge period, the constant inclination of the reference voltage indicative of the per-unit-time voltage change amount being set as a constant value.

3. The power device in claim 1, wherein
  the reference voltage generator generates the reference voltage such that, when a time from a start of the pre-charge period to a start of the sub-period is longer, the per-unit-time voltage change amount becomes greater.

4. The power device in claim 1, wherein
  the reference voltage generator includes a constant current circuit outputting a constant electric current and a reference capacitor generating the reference voltage by using the constant electric current.

5. The power device in claim 1, wherein
  the reference voltage generator includes a counter counting up by a preset value at a preset interval and a D/A converter outputting the reference voltage according to a count-up value of the counter.

6. The power device in claim 4, wherein
  the reference voltage has a negative temperature characteristic.

* * * * *